(12) United States Patent
Busch et al.

(10) Patent No.: US 7,413,952 B2
(45) Date of Patent: *Aug. 19, 2008

(54) METHODS OF FORMING A PLURALITY OF CIRCUIT COMPONENTS AND METHODS OF FORMING A PLURALITY OF STRUCTURES SUSPENDED ELEVATIONALLY ABOVE A SUBSTRATE

(75) Inventors: Brett W. Busch, Boise, ID (US); Fred D. Fishburn, Boise, ID (US); James Rominger, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/646,051

(22) Filed: Dec. 26, 2006

(65) Prior Publication Data

US 2007/0105303 A1 May 10, 2007

Related U.S. Application Data

(63) Continuation of application No. 10/928,931, filed on Aug. 27, 2004, now Pat. No. 7,202,127.

(51) Int. Cl.
*H01L 21/8242* (2006.01)

(52) U.S. Cl. ............... 438/253; 438/296; 257/E21.648

(58) Field of Classification Search ......... 438/253–256, 438/396–399, 238, 381; 257/E21.648
See application file for complete search history.

(56) References Cited

U.S. PATENT DOCUMENTS 4,517,729 A   5/1985  Batra (Continued)

FOREIGN PATENT DOCUMENTS

DE          4447804          1/2002

(Continued)

OTHER PUBLICATIONS

Banhart, *Aluminum Foams: On the Road to Real Applications*, MRS Bulletin, pp. 290-295 (Apr. 2003).

(Continued)

*Primary Examiner*—H. Jey Tsai
(74) *Attorney, Agent, or Firm*—Wells St. John P.S.

(57) ABSTRACT

A plurality of capacitor electrode openings is formed within capacitor electrode-forming material. A first set of the openings is formed to a depth which is greater within the capacitor electrode-forming material than is a second set of the openings. Conductive first capacitor electrode material is formed therein. A sacrificial retaining structure is formed elevationally over both the first capacitor electrode material and the capacitor electrode-forming material, leaving some of the capacitor electrode-forming material exposed. With the retaining structure in place, at least some of the capacitor electrode-forming material is etched from the substrate effective to expose outer sidewall surfaces of the first capacitor electrode material. Then, the sacrificial retaining structure is removed from the substrate, and then capacitor dielectric material and conductive second capacitor electrode material are formed over the outer sidewall surfaces of the first capacitor electrode material formed within the first and second sets of capacitor openings.

30 Claims, 8 Drawing Sheets

U.S. PATENT DOCUMENTS

| | | |
|---|---|---|
| 5,236,860 A | 8/1993 | Fazan et al. |
| 5,340,763 A | 8/1994 | Dennison |
| 5,401,681 A | 3/1995 | Dennison |
| 5,467,305 A | 11/1995 | Bertin et al. |
| 5,498,562 A | 3/1996 | Dennison et al. |
| 5,532,089 A | 7/1996 | Adair et al. |
| 5,604,696 A | 2/1997 | Takaishi |
| 5,605,857 A | 2/1997 | Jost et al. |
| 5,652,164 A | 7/1997 | Dennison et al. |
| 5,654,222 A | 8/1997 | Sandhu et al. |
| 5,686,747 A | 11/1997 | Jost et al. |
| 5,702,990 A | 12/1997 | Jost et al. |
| 5,705,838 A | 1/1998 | Jost et al. |
| 5,767,561 A | 6/1998 | Frei et al. |
| 5,821,140 A | 10/1998 | Jost et al. |
| 5,869,382 A | 2/1999 | Kubota |
| 5,900,660 A | 5/1999 | Jost et al. |
| 5,955,758 A | 9/1999 | Sandhu et al. |
| 5,981,350 A | 11/1999 | Geusic et al. |
| 5,990,021 A | 11/1999 | Prall et al. |
| 6,037,212 A | 3/2000 | Chao |
| 6,037,218 A | 3/2000 | Dennison et al. |
| 6,059,553 A | 5/2000 | Jin et al. |
| 6,090,700 A | 7/2000 | Tseng |
| 6,108,191 A | 8/2000 | Bruchhaus et al. |
| 6,110,774 A | 8/2000 | Jost et al. |
| 6,133,620 A | 10/2000 | Uochi |
| 6,180,450 B1 | 1/2001 | Dennison |
| 6,204,143 B1 | 3/2001 | Roberts et al. |
| 6,204,178 B1 | 3/2001 | Marsh |
| 6,258,650 B1 | 7/2001 | Sunouchi |
| 6,274,497 B1 | 8/2001 | Lou |
| 6,303,518 B1 | 10/2001 | Tian et al. |
| 6,303,956 B1 | 10/2001 | Sandhu et al. |
| 6,323,528 B1 | 11/2001 | Yamazaki et al. |
| 6,331,461 B1 | 12/2001 | Juengling |
| 6,372,554 B1 | 4/2002 | Kawakita et al. |
| 6,383,861 B1 | 5/2002 | Gonzalez et al. |
| 6,399,490 B1 | 6/2002 | Jammy et al. |
| 6,403,442 B1 | 6/2002 | Reinberg |
| 6,432,472 B1 | 8/2002 | Farrell et al. |
| 6,458,653 B1 | 10/2002 | Jang |
| 6,458,925 B1 | 10/2002 | Fasano |
| 6,459,138 B2 | 10/2002 | Reinberg |
| 6,617,222 B1 | 9/2003 | Coursey |
| 6,645,869 B1 | 11/2003 | Chu et al. |
| 6,656,748 B2 | 12/2003 | Hall et al. |
| 6,667,502 B1 | 12/2003 | Agarwal et al. |
| 6,673,693 B2 | 1/2004 | Kirchhoff |
| 6,709,978 B2 | 3/2004 | Geusic et al. |
| 6,720,232 B1 | 4/2004 | Tu et al. |
| 6,767,789 B1 | 7/2004 | Bronner et al. |
| 6,784,112 B2 | 8/2004 | Arita et al. |
| 6,812,513 B2 | 11/2004 | Geusic et al. |
| 6,822,261 B2 | 11/2004 | Yamazaki et al. |
| 6,844,230 B2 | 1/2005 | Reinberg |
| 6,849,496 B2 | 2/2005 | Jaiprakash et al. |
| 6,897,109 B2 | 5/2005 | Jin et al. |
| 6,927,122 B2 | 8/2005 | Geusic et al. |
| 6,930,640 B2 | 8/2005 | Chung et al. |
| 7,042,040 B2 | 5/2006 | Horiguchi |
| 7,064,365 B2 | 6/2006 | An et al. |
| 7,073,969 B2 | 7/2006 | Kamm |
| 7,074,669 B2 | 7/2006 | Iijima et al. |
| 7,081,384 B2 | 7/2006 | Birner et al. |
| 7,084,451 B2 | 8/2006 | Forbes et al. |
| 7,125,781 B2 | 10/2006 | Manning et al. |
| 7,160,788 B2 | 1/2007 | Sandhu et al. |
| 7,179,706 B2 | 2/2007 | Patraw et al. |
| 7,199,005 B2 | 4/2007 | Sandhu et al. |
| 7,202,127 B2 * | 4/2007 | Busch et al. .......... 438/253 |
| 2001/0012223 A1 | 8/2001 | Kohyama |
| 2001/0026974 A1 | 10/2001 | Reinberg |
| 2002/0022339 A1 | 2/2002 | Kirchhoff |
| 2002/0030221 A1 | 3/2002 | Sandhu et al. |
| 2002/0039826 A1 | 4/2002 | Reinberg |
| 2002/0086479 A1 | 7/2002 | Reinberg |
| 2002/0090779 A1 | 7/2002 | Jang |
| 2002/0098654 A1 | 7/2002 | Durcan et al. |
| 2002/0153589 A1 | 10/2002 | Oh |
| 2002/0153614 A1 | 10/2002 | Ema et al. |
| 2002/0163026 A1 | 11/2002 | Park |
| 2003/0153146 A1 | 8/2003 | Won et al. |
| 2003/0178684 A1 | 9/2003 | Nakamura |
| 2003/0190782 A1 | 10/2003 | Ko et al. |
| 2003/0227044 A1 | 12/2003 | Park |
| 2004/0018679 A1 | 1/2004 | Yu et al. |
| 2004/0056295 A1 | 3/2004 | Agarwal et al. |
| 2004/0188738 A1 | 9/2004 | Farnworth et al. |
| 2005/0051822 A1 | 3/2005 | Manning |
| 2005/0054159 A1 | 3/2005 | Manning et al. |
| 2005/0158949 A1 | 7/2005 | Manning |
| 2005/0287780 A1 | 12/2005 | Manning et al. |
| 2006/0014344 A1 | 1/2006 | Manning |
| 2006/0024958 A1 | 2/2006 | Ali |
| 2006/0046420 A1 | 3/2006 | Manning |
| 2006/0051918 A1 | 3/2006 | Busch et al. |
| 2006/0063344 A1 | 3/2006 | Manning et al. |
| 2006/0063345 A1 | 3/2006 | Manning et al. |
| 2006/0115951 A1 | 6/2006 | Mosley |
| 2006/0121672 A1 | 6/2006 | Basceri et al. |
| 2006/0186451 A1 | 8/2006 | Dusberg et al. |
| 2006/0211211 A1 | 9/2006 | Sandhu et al. |
| 2006/0261440 A1 | 11/2006 | Manning |
| 2006/0263968 A1 | 11/2006 | Manning |
| 2007/0032014 A1 | 2/2007 | Sandhu et al. |
| 2007/0048976 A1 | 3/2007 | Raghu |
| 2007/0099328 A1 | 3/2007 | Chiang et al. |
| 2007/0145009 A1 | 6/2007 | Fucsko et al. |

FOREIGN PATENT DOCUMENTS

| | | |
|---|---|---|
| KR | 20010061020 | 7/2001 |
| KR | 20010114003 | 12/2001 |
| WO | US06/06806 | 1/2004 |
| WO | 2004/027898 | 8/2004 |
| WO | US06/06806 | 8/2004 |
| WO | US0806806 | 8/2004 |
| WO | 2004/040252 | 12/2004 |
| WO | WO 2005/024936 | 3/2005 |
| WO | 2006/006806 | 3/2007 |

OTHER PUBLICATIONS

Crouse et al., *Self-Assembled Nanostructures Using Anodized Alumina Thin Films for Optoelectronic Applications*, IEEE, pp. 234-235 (1999).

Gibson et al., *Cellular Solids*, MRS Bulletin, pp. 270-274 (Apr. 2003).

Green et al., *Cellular Ceramics: Intriguing Structures, Novel Properties, and Innovative Applications*, MRS Bulletin, pp. 296-300 (Apr. 2003).

Green et al., *The Structure and Applications of Cellular Ceramics*, Web Extra, 10 pages (Apr. 2003).

Karp et al., *Scaffolds for Tissue Engineering*, MRS Bulletin, pp. 301-306 (Apr. 2003).

Kim et al., *A Mechanically Enhanced Storage Node for Virtually Unlimited Height (MESH) Capacitor Aiming at Sub 70nm DRAMs*, IEEE, pp. 69-72 (Jan. 2004).

Konovalov et al., *Chemistry of Materials*, Chem. Mater., vol. 11, No. 8, pp. 1949-1951 (Aug. 1999).

Kraynik, *Foam Structure: From Soap Froth to Solid Foams*, MRS Bulletin, pp. 275-276 (Apr. 2003).

Liang et al., *Nonlithographic Fabrication of Lateral Superlattices for Nanometric Electromagnetic-Optic . . .* , IEEE J. Selected Topics in Quantum Electr., vol. 8, No. 5, pp. 998-1008 (Sep./Oct. 2002).

Liu et al., *Ordered anodic alumina nanochannels on focused-ion-beam-prepatterned aluminum surfaces*, Appl. Phys. Lett., vol. 78, No. 1, pp. 120-122 (Jan. 2001).

Maire et al., *In Situ X-Ray Tomography Measurements of Deformation in Cellular Solids*, MRS Bulletin, pp. 284-289 (Apr. 2003).

Masuda et al., *Highly ordered nanochannel-array architecture in anodic alumina*, App. Phys. Lett, vol. 71 No. 19, pp. 2770-2772 (Nov. 1997).

Nadeem et al., *Fabrication of Microstructures Using Aluminum Anodization Techniques*, pp. 274-277 (pre-2004).

Oh et al., *Preparation and Pore-Characteristics Control of Nano-Porous Materials Using Organometallic Building Blocks*, 4 Carbon Science, No. 1, pp. 1-9 (Mar. 2003).

Onck, *Scale Effects in Cellular Metals*, MRS Bulletin, pp. 279-283 (Apr. 2003).

O'Sullivan et al., *The morphology and mechanism of formation of porous anodic films on aluminium*, Proc. Roy. Soc. Lond. A, vol. 317, pp. 511-543 (1970).

Park et al., *Block Copolymer Lithography: Periodic Arrays of ~$10^{11}$ Holes in 1 Square Centimeter*, 276 SCIENCE, pp. 1401-1404 (May 30, 1997).

Park et al., *Novel Robust Cell Capacitor (Leaning Exterminated Ring type Insulator) and New Storage Node Contact (Top Spacer Contact) . . .* , Symposium on VLSI Technology Digest of Technical Papers, IEEE, pp. 34-35 (2004).

Shingubara, *Fabrication of nanomaterials using porous alumina templates*, J. Nanoparticle Res., vol. 5, pp. 17-30 (2003).

Tan et al., *High Aspect Ratio Microstructures on Porous Anodic Aluminum Oxide*, IEEE, pp. 267-272 (1995).

Tsukada et al., *Preparation and Application of Porous Silk Fibroin Materials*, 54 Journal of Applied Polymer Science, pp. 507-514 (1994).

U.S. Appl. No. 10/733,181, filed Dec. 2003, Manning et al.
U.S. Appl. No. 10/894,633, filed Jul. 2004, Manning.
U.S. Appl. No. 11/006,331, filed Dec. 2004, Basceri et al.
U.S. Appl. No. 11/083,489, filed Mar. 2005, Sandhu et al.
U.S. Appl. No. 11/131,552, filed May 2005, Manning.
U.S. Appl. No. 11/131,575, filed May 2005, Manning.
U.S. Appl. No. 11/196,593, filed Aug. 2005, Sandhu et al.
U.S. Appl. No. 11/272,232, filed Nov. 2005, Manning et al.
U.S. Appl. No. 11/272,247, filed Nov. 2005, Manning et al.
U.S. Appl. No. 11/360,540, filed Feb. 2006, Rana.
U.S. Appl. No. 11/580,418, filed Oct. 2006, Raghu et al.

Li et al., "*Metal-assisted chemical etching in HF/H2O2 produces porous silicon*", American Institute of Physics, vol. 77, No. 16., 2000, pp. 2572-2574.

Yasaitis, et al., "A modular process for integrating thick polysilicon MEMS devices with sub-micron CMOS", Analog Devices, www.eecs.berkeley.edu/~boser/publications/yasaitis03.pdf. unknown date.

* cited by examiner

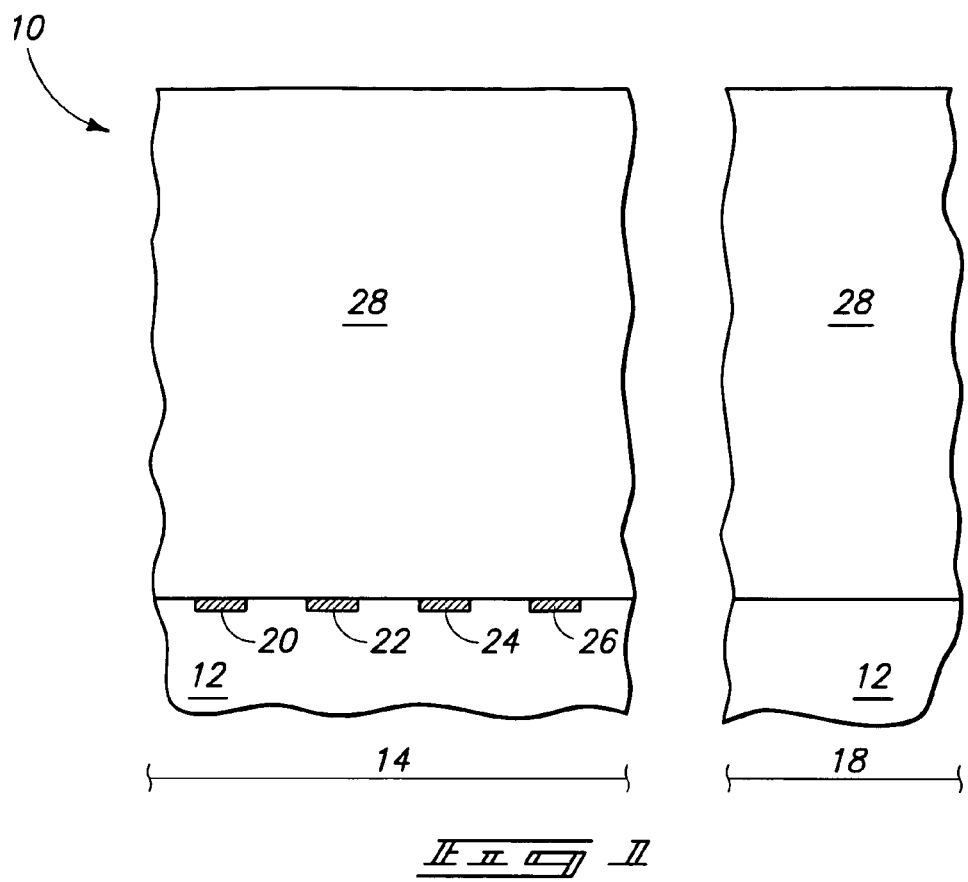
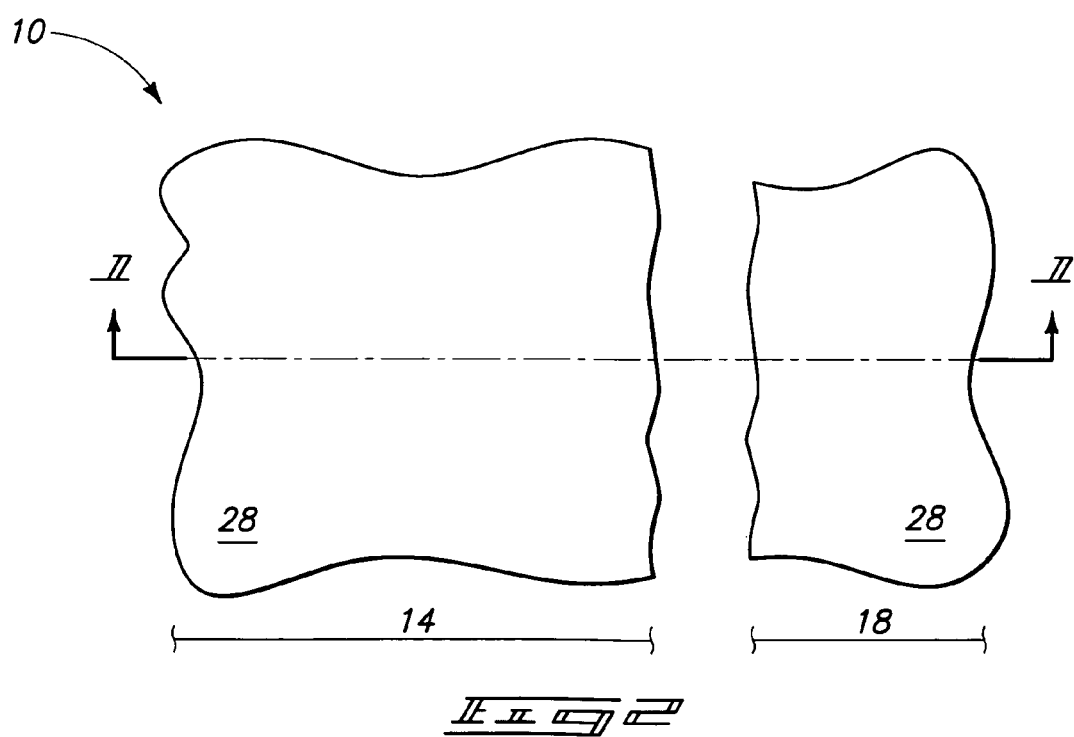

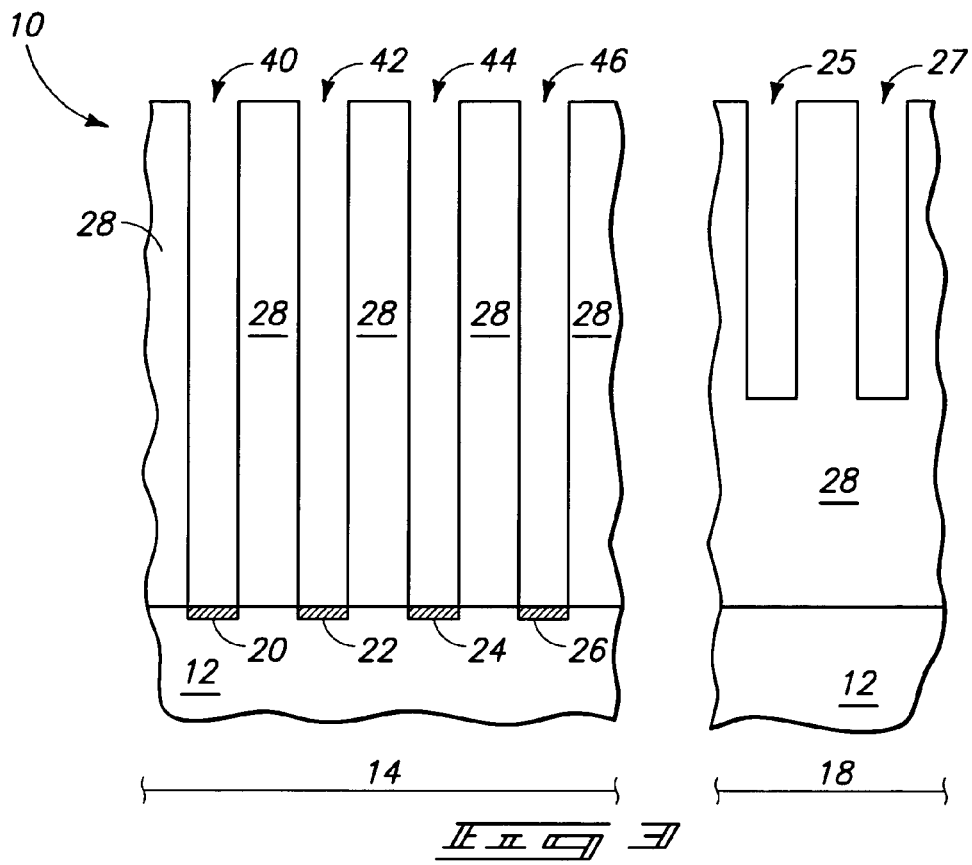
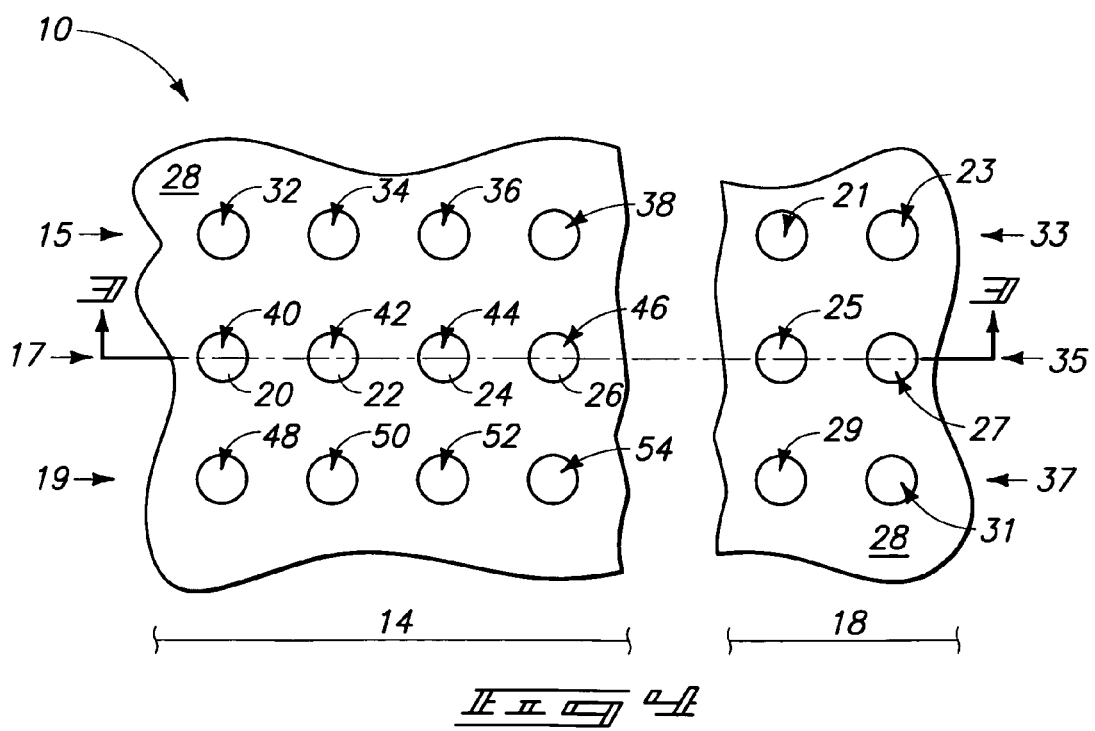

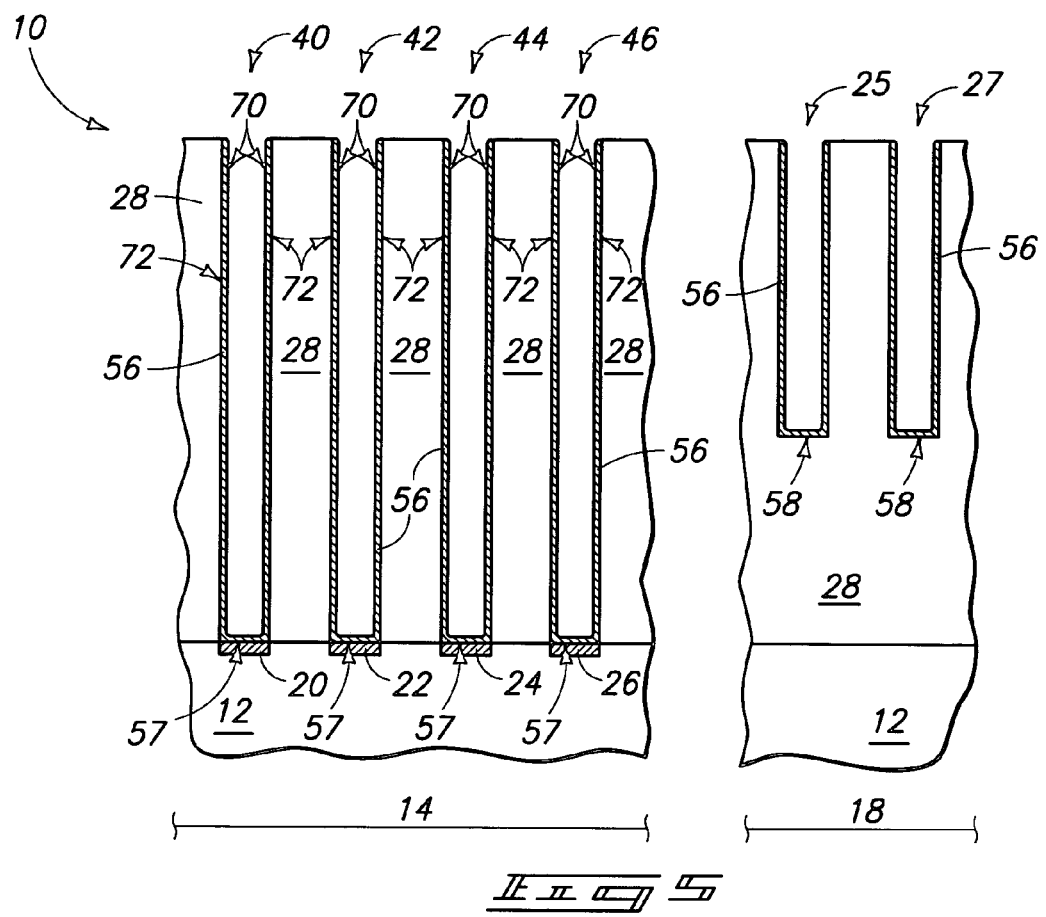
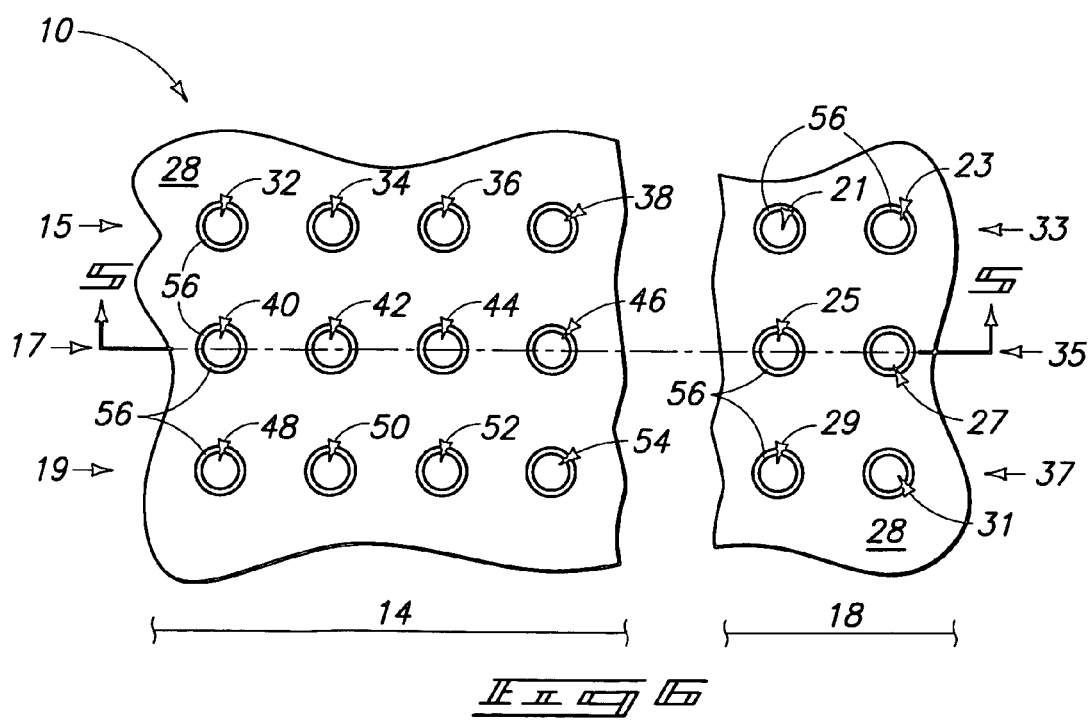

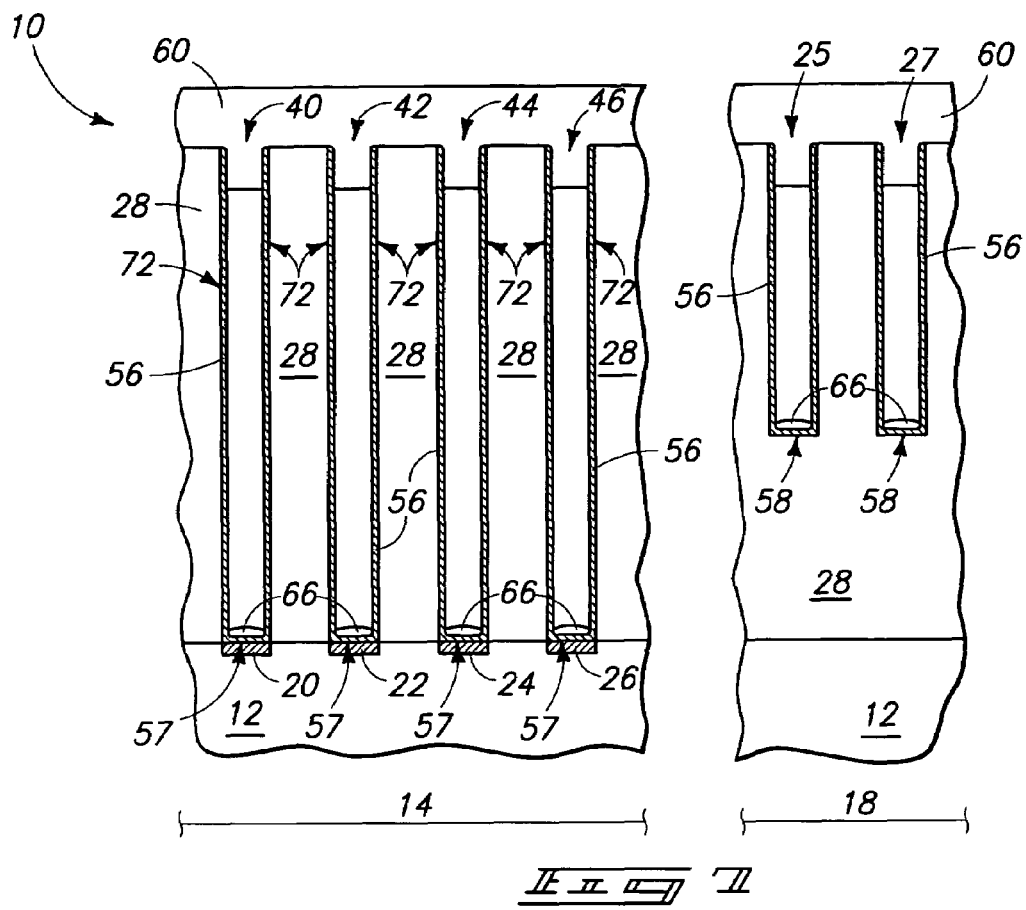
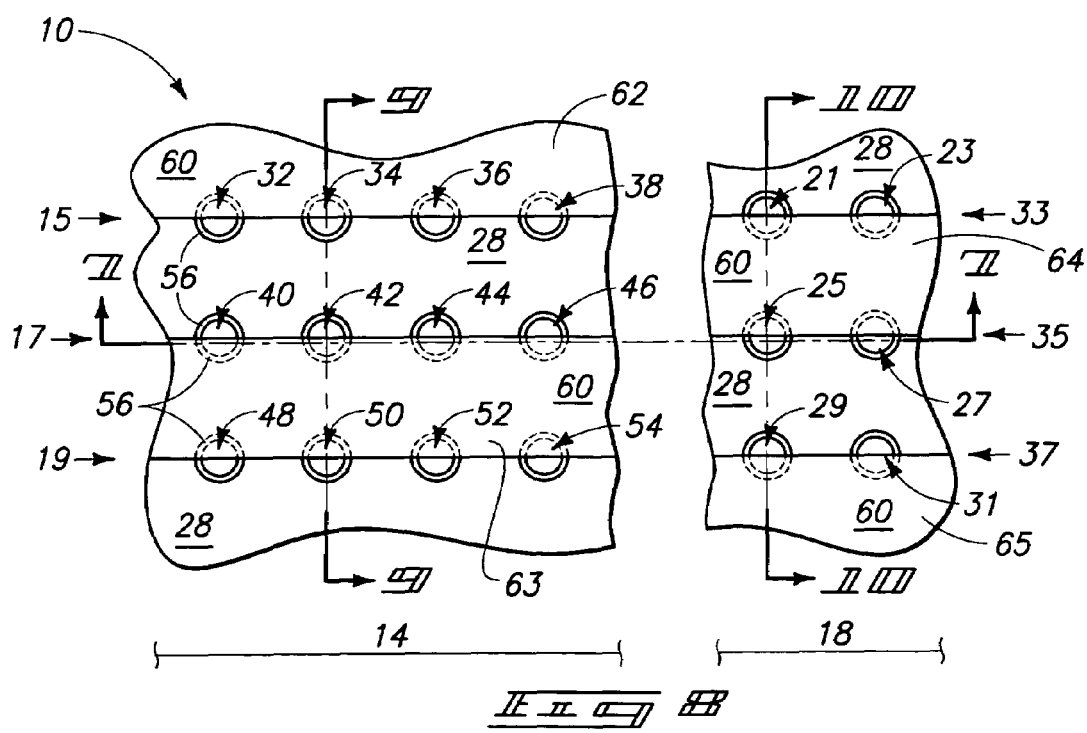

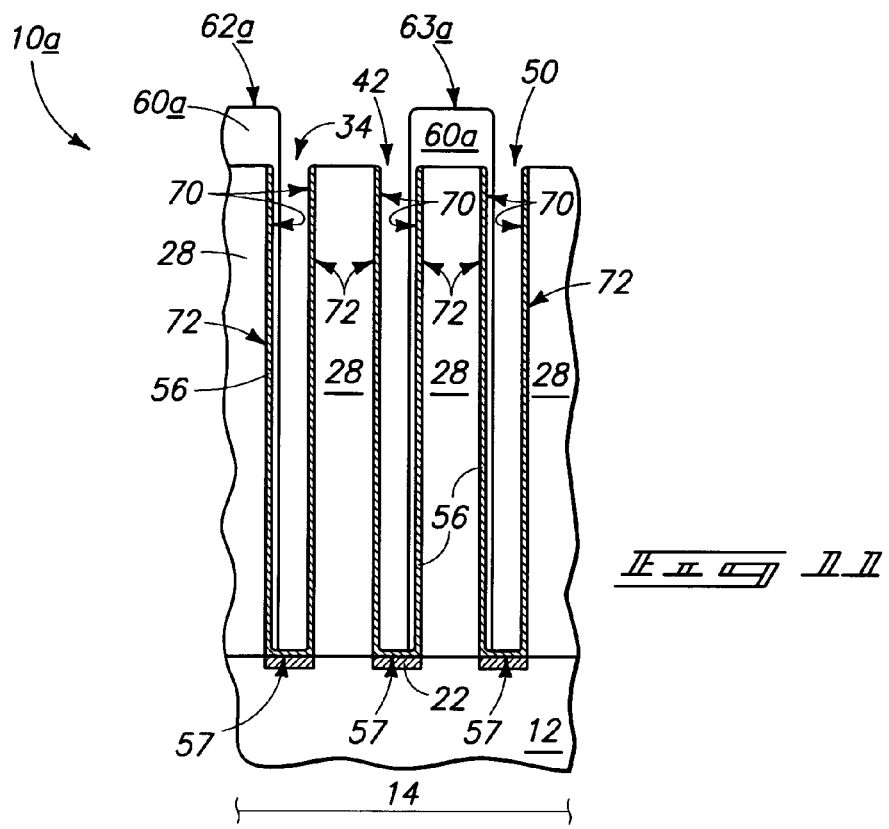
_FIG. 11_
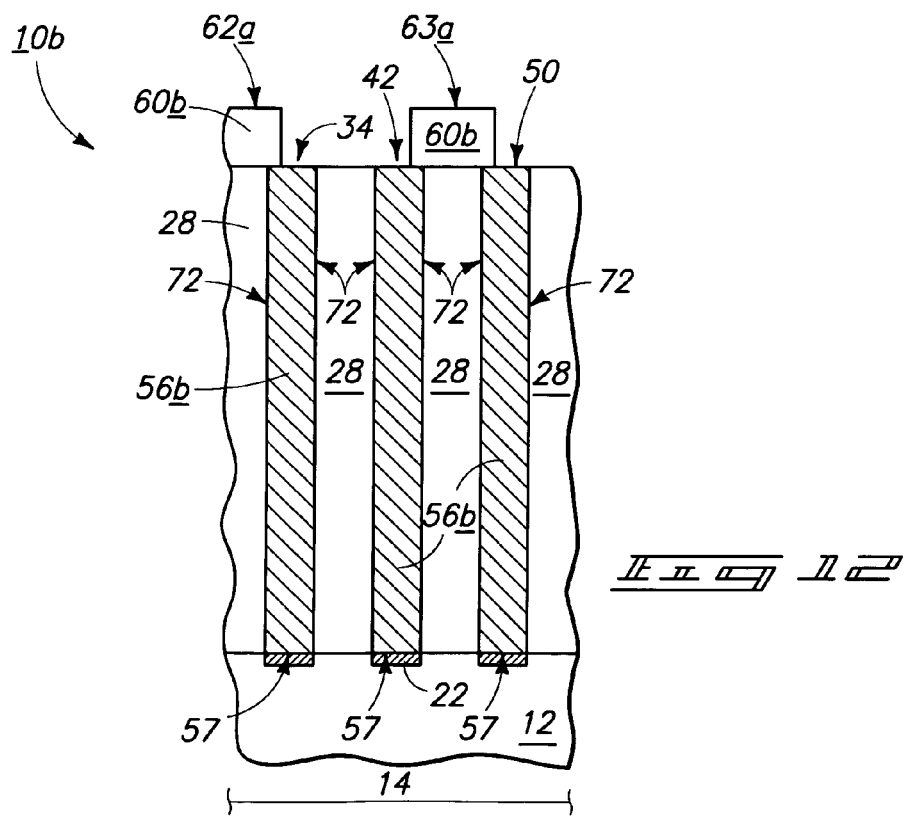
_FIG. 12_

METHODS OF FORMING A PLURALITY OF CIRCUIT COMPONENTS AND METHODS OF FORMING A PLURALITY OF STRUCTURES SUSPENDED ELEVATIONALLY ABOVE A SUBSTRATE

RELATED PATENT DATA

This patent resulted from a continuation application of U.S. patent application Ser. No. 10/928,931, filed Aug. 27, 2004, entitled "Methods of Forming a Plurality of Capacitors", naming Brett W. Busch, Fred D. Fishburn and James Rominger as inventors, and which is now U.S. Pat. No. 7,202,127, the disclosure of which is incorporated by reference.

TECHNICAL FIELD

This invention relates to methods of forming a plurality of capacitors.

BACKGROUND OF THE INVENTION

Capacitors are one type of component which is commonly used in the fabrication of integrated circuit, for example in DRAM circuitry. A typical capacitor is comprised of two conductive electrodes separated by a non-conducting dielectric region. As integrated circuitry density has increased, there is a continuing challenge to maintain sufficiently high storage capacitance despite typical decreasing capacitor area. The increase in density of integrated circuitry has typically resulted in greater reduction in the horizontal dimension of capacitors as compared to the vertical dimension. In some cases, the vertical dimension of capacitors has increased.

One manner of forming capacitors is to initially form an insulative material within which an initial of one of the capacitor electrodes is formed. For example, an array of capacitor electrode openings (also referred to as storage node openings) for individual capacitors is typically fabricated in such insulative capacitor electrode-forming material. One typical capacitor electrode-forming material is silicon dioxide doped with one or both of phosphorus and boron. One common capacitor electrode construction is a so-called container capacitor or device. Here, a container or cup-like shaped capacitor electrode is formed within the opening. A capacitor dielectric material and another capacitor electrode are formed thereover within the container. Where it is desired to utilize the outer lateral surfaces of the container or other electrode shape, the capacitor electrode-forming material is typically etched back after forming the initial electrode to expose outer lateral side surfaces thereof and prior to forming the capacitor dielectric material.

The etch which is used to form the capacitor electrode openings can unfortunately be non-uniform across a wafer being fabricated. For example, typically at the edge of the wafer, it is recognized that some of this area will not be usable for fabricating integrated circuitry. Further in this area, the etch which is conducted to form the container openings typically does not extend nearly as deep into the substrate as occurs in other areas where usable circuitry die are fabricated, for example in area displaced from the wafer edge. Such results in the capacitor electrode structures formed in this edge area as not being as deep into the capacitor electrode-forming material as elsewhere over the wafer. Unfortunately, the etch back of the capacitor electrode-forming material to expose the outer lateral sides of the capacitor electrodes is typically wet and can exceed the depth of the these peripherally formed electrodes. Thereby, such electrodes are no longer retained on the wafer in their original positions, and accordingly lift off the wafer and redeposit elsewhere, leading to fatal defects.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention comprises methods of forming a plurality of capacitors. In one implementation, a plurality of capacitor electrode openings are formed within capacitor electrode-forming material received over a substrate. A first set of the plurality of capacitor electrode openings is formed to a depth which is greater within the capacitor electrode-forming material than is a second set of the plurality of capacitor electrode openings. Conductive first capacitor electrode material is formed within the first and second sets of the plurality of capacitor electrode openings. The first capacitor electrode material comprises respective bases within the first and second sets of the plurality of capacitor electrode openings. A sacrificial retaining structure is formed elevationally over both the first capacitor electrode material and the capacitor electrode-forming material. The retaining structure leaves some of the capacitor electrode-forming material exposed. With the sacrificial retaining structure over the substrate, at least some of the capacitor electrode-forming material is etched from the substrate effective to expose outer sidewall surfaces of the first capacitor electrode material. After the etching, the sacrificial retaining structure is removed from the substrate, and then capacitor dielectric material and conductive second capacitor electrode material are formed over the outer sidewall surfaces of the first capacitor electrode material formed within the first and second sets of capacitor openings.

In one implementation, the capacitor electrode-forming material comprises silicon dioxide. After forming the first capacitor electrode material, a sacrificial retaining structure is formed elevationally over both the first capacitor electrode material and the capacitor electrode-forming material. The sacrificial retaining structure has a substantially planar base received on both silicon dioxide of the capacitor electrode-forming material and on the first capacitor electrode material.

In one implementation, the capacitor electrode-forming material is homogeneous. After forming such material, a sacrificial retaining structure is formed elevationally over both the first capacitor electrode material and the homogeneous capacitor electrode-forming material, with the sacrificial retaining structure being received on the homogeneous capacitor electrode-forming material.

In one implementation, the sacrificial retaining structure comprises at least one of polysilicon, amorphous carbon and silicon nitride, and has a substantially planar base received elevationally over the first capacitor electrode material and elevationally over the capacitor electrode-forming material.

Other aspects and implementations are contemplated.

BRIEF DESCRIPTION OF THE DRAWINGS

Preferred embodiments of the invention are described below with reference to the following accompanying drawings.

FIG. 1 is a diagrammatic, fragmentary sectional view taken through line 1-1 in FIG. 2.

FIG. 2 is a diagrammatic, fragmentary, top plan view of a semiconductor substrate in process in accordance with an aspect of the invention.

FIG. 3 is a view of the FIG. 1 substrate fragment at a processing step subsequent to that depicted by FIG. 1.

FIG. 4 is a view of the FIG. 2 substrate fragment at a processing step subsequent to that depicted by FIG. 2.

FIG. 5 is a view of the FIG. 3 substrate fragment at a processing step subsequent to that depicted by FIG. 3.

FIG. 6 is a view of the FIG. 4 substrate fragment at a processing step subsequent to that depicted by FIG. 4.

FIG. 7 is a view of the FIG. 5 substrate fragment at a processing step subsequent to that depicted by FIG. 5.

FIG. 8 is a view of the FIG. 6 substrate fragment at a processing step subsequent to that depicted by FIG. 6.

FIG. 11 is an alternate embodiment to that depicted by FIG. 9.

FIG. 12 is another alternate embodiment to that depicted by FIG. 9.

DETAILED DESCRIPTION OF THE PREFERRED EMBODIMENTS

Figure 9:
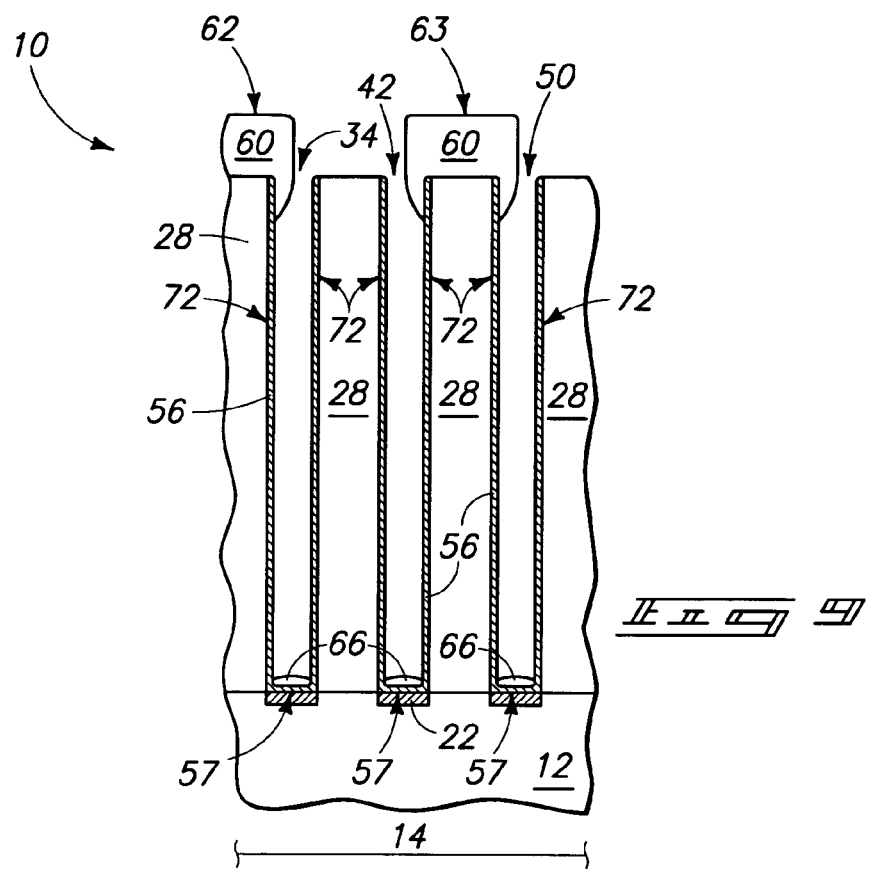
FIG. 9 is a sectional view taken through line 9-9 in FIG. 8.

This disclosure of the invention is submitted in furtherance of the constitutional purposes of the U.S. Patent Laws "to promote the progress of science and useful arts" (Article 1, Section 8).

Exemplary preferred embodiments of methods of forming a plurality of capacitors are described with reference to FIGS. 1-16. U.S. Patent Application Publication No. 2005/0054159 A1, entitled, "Semiconductor Constructions, and Methods of Forming Capacitor Devices", filed Dec. 10, 2003, naming H. Montgomery Manning, Thomas M. Graettinger, and Marsela Pontoh as inventors, is hereby fully incorporated by reference as if included in its entirety herein.

Referring to FIG. 1, a semiconductor substrate in process in accordance with an aspect of the invention is indicated generally with reference to numeral 10. Such comprises a substrate 12 which in one exemplary embodiment comprises a semiconductor substrate, for example comprised of bulk monocrystalline silicon or other material. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

The discussion proceeds in a preferred embodiment method of forming an array of capacitors, for example as might be utilized in DRAM or other memory circuitry construction. Substrate fragment 10 can be considered as comprising a region 14 and a region 18. In conjunction with the problem identified in the "Background" section above which motivated the invention, region 18 might be located more proximate an edge of the substrate/wafer than is region 14. Of course, such regions might be located elsewhere over the substrate, and regardless reference or inclusion of multiple regions is not a requirement of aspects of the invention.

A plurality of electrically conductive node locations 20, 22, 24 and 26 is shown within region 14 of substrate 12. Node locations 20, 22, 24 and 26 can correspond to, for example, conductively-doped diffusion regions within a semiconductive material of substrate 12, and/or to conductive pedestals associated with substrate 12. Node locations 20, 22, 24 and 26 might be electrically conductive at this processing stage of FIG. 1, although electrical conductivity might be provided at a processing stage subsequent to that shown by FIG. 1. By way of example only, node locations 20, 22, 24 and 26 might ultimately be electrically connected with transistor constructions (not shown) and can correspond to source/drain regions of the transistor constructions, or can be ohmically connected to source/drain regions of transistor constructions. Transistor gates and other components of the transistor constructions can be present within region 14 at the processing point depicted by FIG. 1, or can be formed in subsequent processing. Of course processing independent of memory array fabrication is also contemplated.

A capacitor electrode-forming material 28 has been deposited over substrate 12. In the context of this document, a "capacitor electrode-forming material" is that material within which capacitor electrode openings are formed to a depth which encompasses such material, and as will be apparent from the continuing discussion. In one exemplary preferred embodiment, capacitor electrode-forming material 28 comprises silicon dioxide, more preferably silicon dioxide which is doped with at least one of boron and phosphorus, with borophosphosilicate glass (BPSG) being one specific example. Further and regardless, in exemplary preferred implementations, capacitor electrode-forming material 28 is homogeneous. However in other implementations, capacitor electrode-forming material 28 can have the attributes of mass 28 from the incorporated U.S. Patent Application Publication No. 2005/0054159 A1. An exemplary preferred thickness range for mass 28 is from 5,000 Angstroms to 50,000 Angstroms, with 20,000 Angstroms being a specific preferred example.

Referring to FIGS. 3 and 4, a plurality of capacitor electrode openings have been formed within the capacitor electrode-forming material. By way of example only, and in one implementation, a series of capacitor electrode openings 32, 34, 36, 38, 40, 42, 44, 46, 48, 50, 52, and 54 comprise a first set of such capacitor electrode openings formed in capacitor electrode-forming material 28, and exemplary capacitor electrode openings 21, 23, 25, 27, 29 and 31 comprise a second set of the plurality of capacitor electrode openings. Further in accordance with the definition of "capacitor electrode-forming material" provided above, such is that depth portion of material 28 which encompasses the openings, for example the complete depicted depth in region 14 where openings even-numbered 40-46 extend to their respective node locations even-numbered 20-26 and only the depth of material 28 to the bases of openings 25 and 27 in region 18. In this exemplary implementation, and in addressing in one aspect the problem which motivated the invention, the first set of capacitor electrode openings even-numbered 32-54 is formed to a depth within capacitor electrode-forming material 28 which is deeper or greater than that to which second set capacitor electrode openings odd-numbered 21-31 is formed. In the depicted exemplary embodiment, the first set of the plurality of capacitor electrode openings even-numbered 32-54 is formed in a series of lines 15, 17 and 19, and second set of plurality of capacitor electrode openings odd-numbered 21-31 is formed in a series of lines 33, 35 and 37. An exemplary preferred technique for forming the illustrated capacitor electrode openings comprises photolithographic patterning and etch. Openings even-numbered 40-46 by way of example only are shown formed to one common depth within material 28, and openings 25 and 27 are shown formed to a different common depth. Of course however, such openings need not be formed to respective common depths.

Referring to FIGS. 5 and 6, conductive first capacitor electrode material 56 has been formed within the plurality of capacitor electrode openings, including in this particular example the first and second sets of such openings. In one exemplary implementation and for purposes of the continuing. discussion, first capacitor electrode material 56 can be considered as comprising respective bases 57 within the first set of the plurality of capacitor electrode openings even-numbered 32-54 and respective bases 58 within the second set of the plurality of capacitor electrode openings odd-numbered 21-31. The depths within the respective sets in the illustrated embodiment are shown to be the same within material 28, with such not in any way being a requirement. Any electrically conductive material (including more than one material) is suitable for first capacitor electrode material 56, including for example conductively doped semiconductive material, elemental metals, alloys of metals and/or metal compounds. One exemplary preferred material comprises titanium nitride. First capacitor electrode material 56 is shown as being formed within the respective openings in the shape of container-like structures, although pillars and any other structure whether existing or yet-to-be developed are also contemplated. The depicted container constructions can be considered as comprising inner surfaces 70 within the openings formed thereby, and outer lateral side surfaces 72 opposed to those of the inner surfaces.

Referring to FIGS. 7-10, a sacrificial retaining structure 60 has been formed elevationally over both first capacitor electrode material 56 and capacitor electrode-forming material 28. An exemplary preferred thickness range is from 100 Angstroms to 10,000 Angstroms. In one exemplary preferred implementation, retaining structure 60 comprises a series of lines, for example the depicted lines 62 and 63 in region 14, and lines 64 and 65 in region 18. In one implementation, individual of the retaining structure lines run along at least a portion of and overlie two adjacent of the lines of capacitor electrode openings. For example, line 63 is illustrated as overlying lines 17 and 19 of capacitor electrode openings even-numbered 40-46 and 48-54, respectively, and line 64 is shown overlying the exemplary depicted two adjacent lines 33 and 35 of capacitor openings 21, 23 and 25, 27 respectively. Regardless, retaining structure 60 leaves some of capacitor electrode-forming material 28 exposed.

In one exemplary implementation, and as depicted, sacrificial retaining structure 60 is received on homogeneous capacitor electrode-forming material 28. In the context of this document, "on" means in at least some direct physical contact therewith. In one exemplary implementation, retaining structure 60 is homogeneous. Regardless, in one exemplary implementation, retaining structure 60 is insulative. By way of example only, preferred insulative materials include photoresist, amorphous carbon, and silicon nitride. In one exemplary implementation, the retaining structure is conductive, with conductively doped polysilicon comprising one example. Other conductive materials, for example metal and/or metal compounds are also contemplated. Further, the invention contemplates the retaining structure as comprising polysilicon regardless of whether conductively doped, including polysilicon which is void of any effective conductivity enhancing doping.

Figure 10:
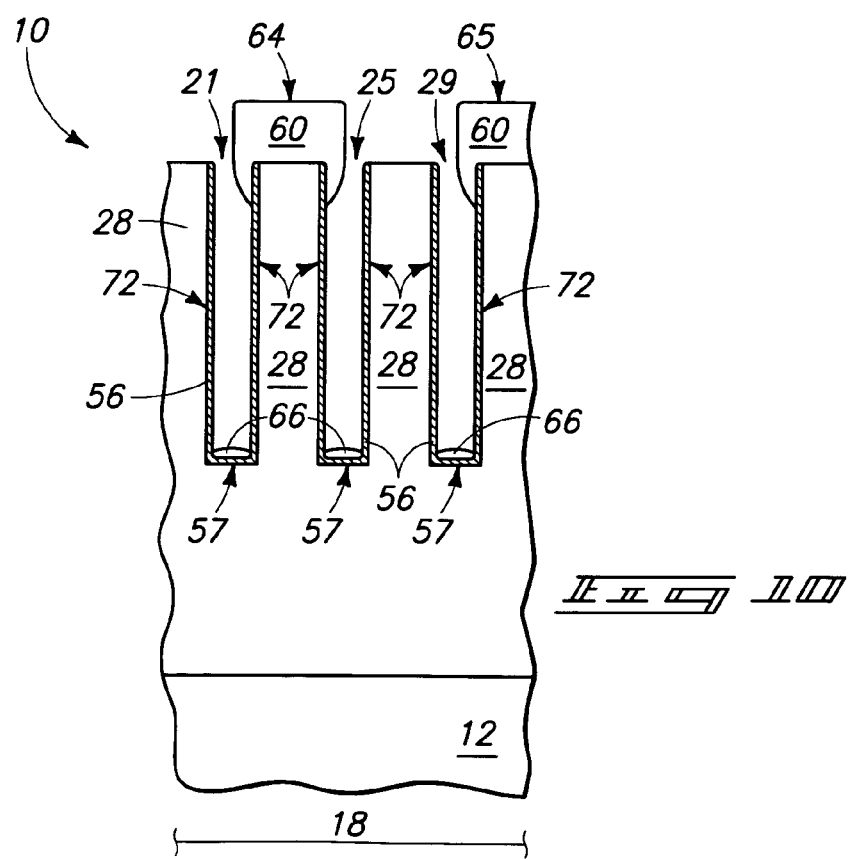
FIG. 10 is a sectional view taken through line 10-10 in FIG. 8.

In one implementation and as depicted, a portion of retaining structure 60 is received within at least some of the capacitor electrode openings within which the first capacitor electrode material is formed. The exemplary preferred profile is with respect to a preferred embodiment photoresist material, whereby some tapering would typically occur as shown at the top of the respective electrodes in FIGS. 9 and 10 when container capacitor electrode constructions are utilized. FIGS. 7, 9 and 10 also depict some of the retaining structure material 60 as having deposited at the base of the respective electrodes, which is depicted in the form of masses 66 (the same material as that of retaining structure 60). Alternately, and by way of example only, retaining structures 60 might be conformal extending entirely along the respective illustrated sidewalls of a given container electrode. For example, FIG. 11 by way of example only depicts an alternate exemplary embodiment substrate fragment 10a corresponding to the FIG. 9 view. Like numerals from the first described embodiment are utilized where appropriate, with differences being indicated with the suffix "a" or with different numerals. FIG. 11 depicts retaining structures 60a extending conformally along inner sidewalls 70 within the respective container openings of the respective electrodes.

The invention also contemplates no portion of the retaining structure being received within the capacitor electrode openings. A first exemplary such embodiment is shown in FIG. 12 with respect to a substrate fragment 10b, with FIG. 12 corresponding positionally to the FIG. 9 section. Like numerals from the first described embodiment have been utilized where appropriate, with differences being indicated with the suffix "b" or with different numerals. FIG. 12 depicts an exemplary embodiment wherein first capacitor electrode material 56b has been deposited to completely fill the respective capacitor electrode openings. Accordingly, no portion of retaining structure 60b is received within any of the capacitor electrode openings.

Figure 13:
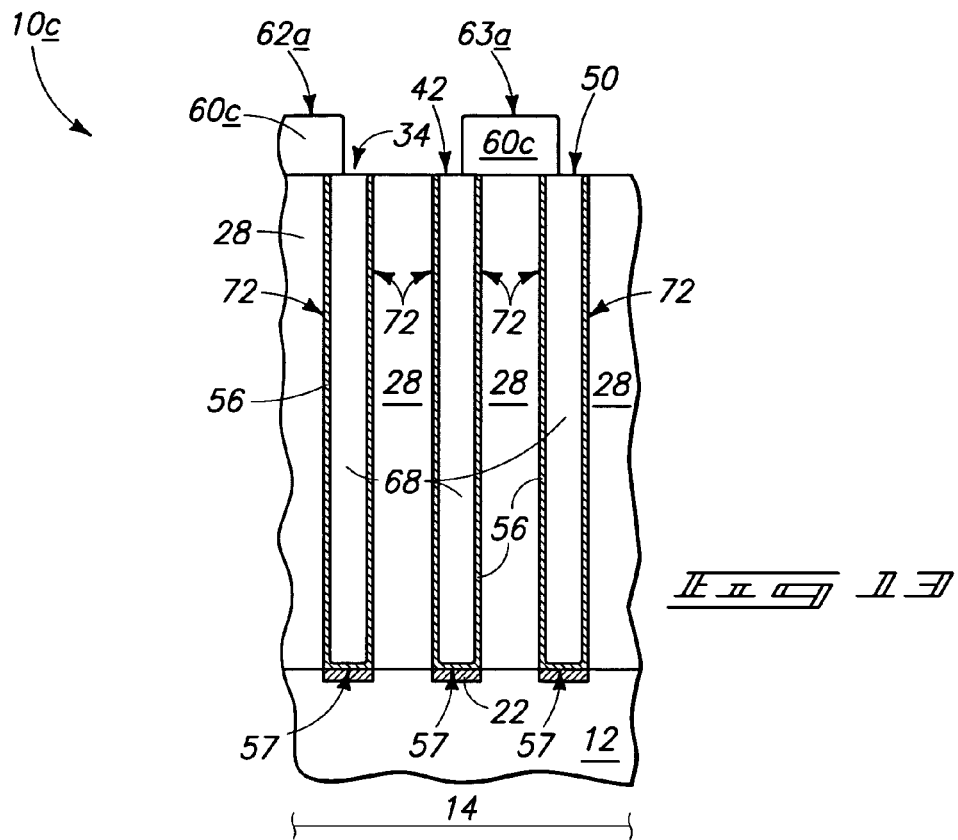
FIG. 13 is still another alternate embodiment to that depicted by FIG. 9.

Alternate exemplary processing with respect to exemplary container structures is described with reference to FIG. 13 in connection with a wafer fragment 10c, with FIG. 13 corresponding positionally to the FIG. 9 section. Like numerals from the first described embodiment have been utilized where appropriate, with differences being indicated with the suffix "c". FIG. 13 depicts the respective container openings formed by material 56 having been filled with a material 68, with exemplary such materials being photoresist, amorphous carbon, spin on dielectric, polysilicon, or any other material that can be removed later selectively relative to the first electrode material. Thereby, no portion of retaining structures 60c is received within the capacitor electrode openings.

The depicted FIGS. 9-11 embodiments depict sacrificial retaining structure 60 as comprising other than a substantially planar base received elevationally over first capacitor electrode material 56 and elevationally over capacitor electrode-forming material 28. Rather, the depicted respective base (meaning that portion which is against materials 28 and 56) of each of retaining structures 60/60a in such figures conforms at least in part to the upper surface of the capacitor electrode-forming material 28 and also along at least some of sidewall surfaces 70 of first capacitor electrode material 56. The exemplary depicted FIGS. 12 and 13 embodiments, by way of example only, do depict sacrificial retaining structures as having a substantially planar base which is received elevationally over both first capacitor electrode material 56b, 56 and capacitor electrode-forming material 28, respectively. In one exemplary preferred embodiment, the sacrificial retaining structure has a substantially planar base which is received on both silicon dioxide of the capacitor electrode-forming material and on the first capacitor electrode material, for example as depicted in FIGS. 12 and 13. In one exemplary embodiment, the sacrificial retaining structure comprises at least one of polysilicon, amorphous carbon and silicon nitride, and has a substantially planar base received elevationally over both the first capacitor electrode material and the capacitor electrode-forming material.

The preferred embodiment depicted retaining structures in the form of lines would likely extend to be received over, connect with, and/or comprise a part of a mass of material 60 received over circuitry area peripheral (not shown) to that of areas where the preferred embodiment array of capacitors is being formed, for example as shown in the U.S. Patent Application Publication No. 2005/0054159 A1, incorporated by reference above.

Figure 14:
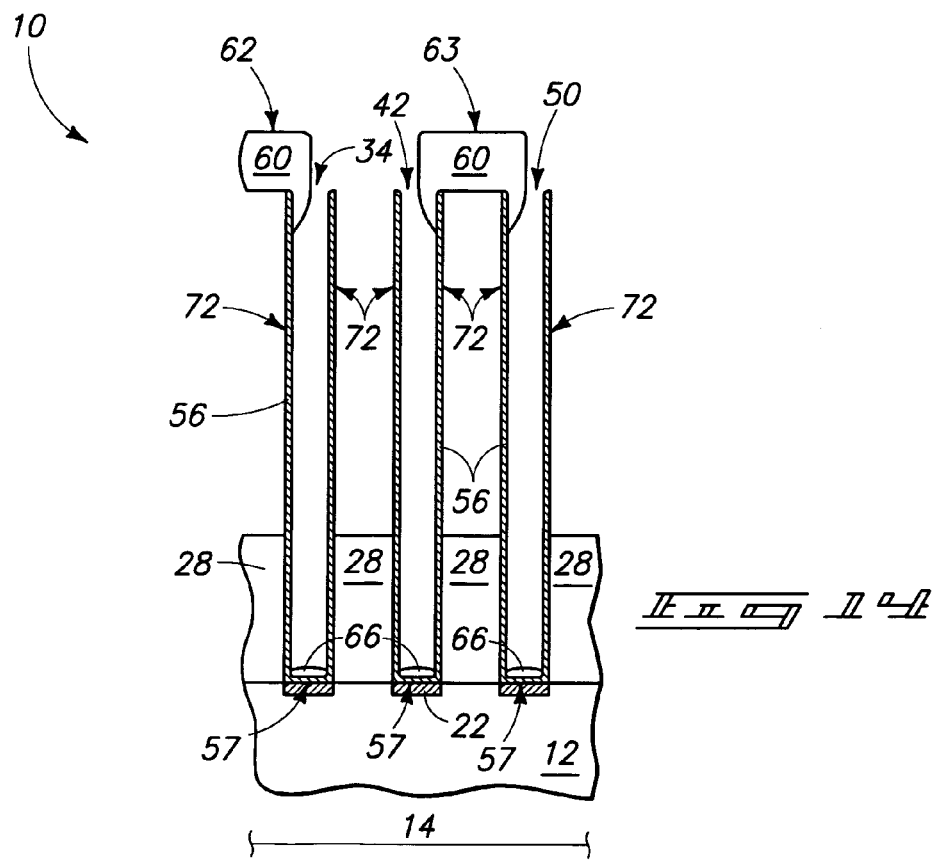
FIG. 14 is a view of the FIG. 9 substrate fragment at a processing, step subsequent to that depicted by FIG. 9.
Figure 15:
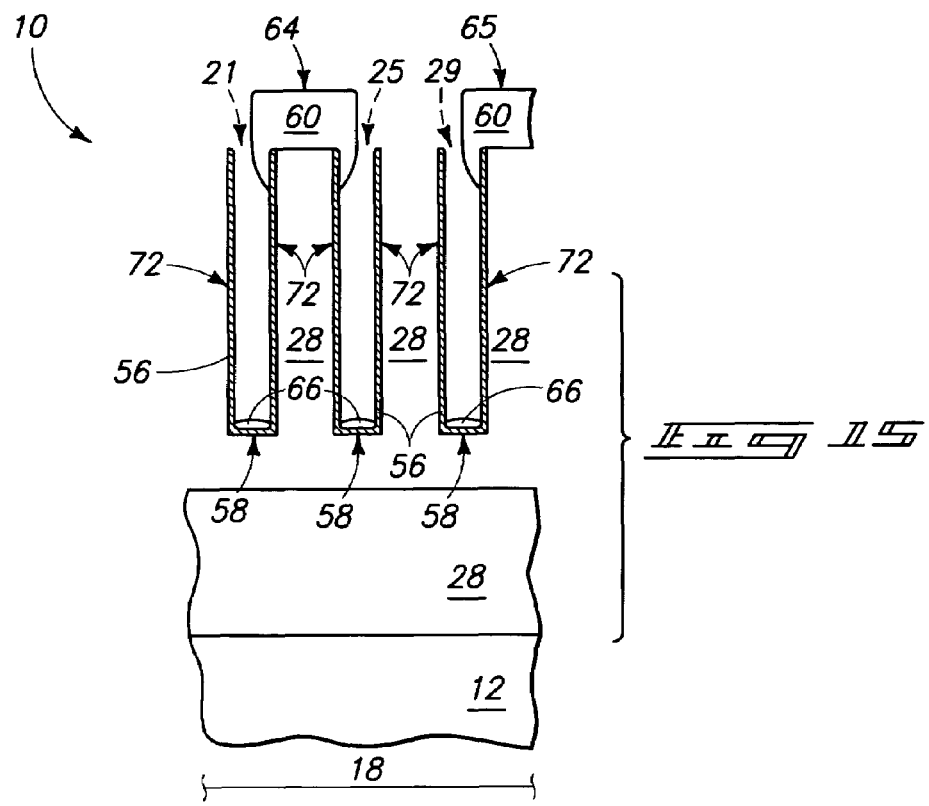
FIG. 15 is a view of the FIG. 10 substrate fragment at a processing step subsequent to that depicted by FIG. 10, and corresponding in sequence to that of FIG. 14.

Referring to FIGS. 14 and 15, and with sacrificial retaining structure 60 over the substrate, at least some of capacitor electrode-forming material 28 is etched from the substrate effective to expose outer sidewall surfaces 72 of first capacitor electrode material 56. Of course, all or only some of such surfaces might be exposed, with only partial exposure being shown in FIG. 14. An exemplary preferred etching is wet etching. Where in conjunction with the problem that motivated the invention there exists a second set of capacitor electrode openings which are not as deep as the desired first set, for example as shown in FIGS. 3, the exemplary etching of material 28 might be to a depth therein which is below the base of the first capacitor electrode material formed in at least one of the capacitor electrode openings of the second set, for example as depicted in FIG. 15. There illustrated, by way of example only, the etching of material 28 has been to an elevation well below the bases 58 of conductive first capacitor electrode material 56, and whereby retaining structure 60 has precluded material 56 from lifting off and being deposited elsewhere over the substrate.

Figure 16:
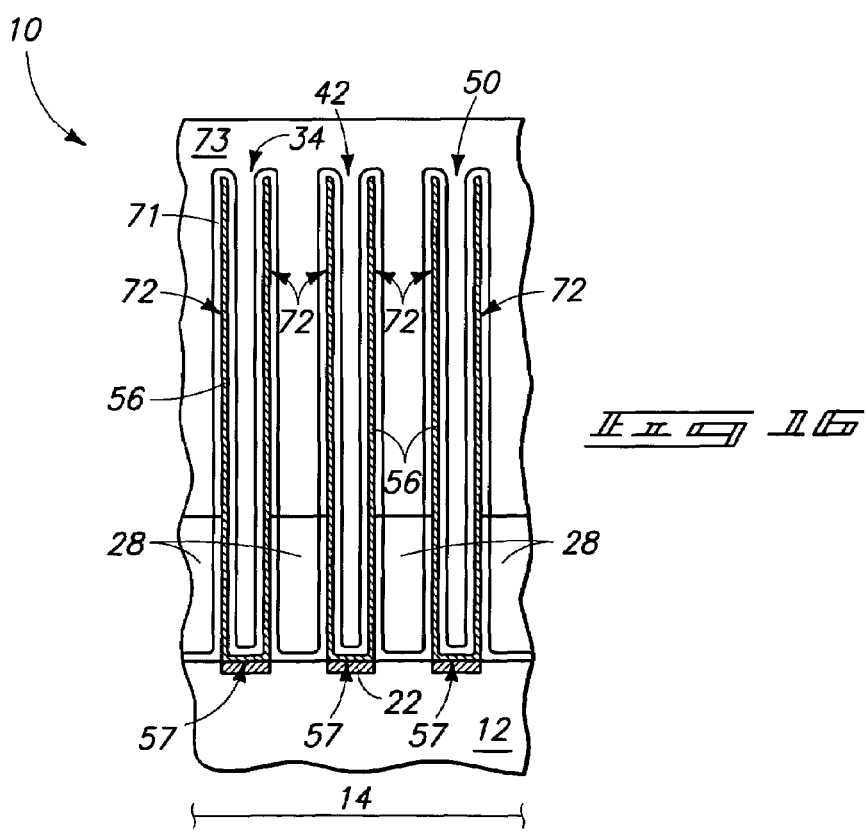
FIG. 16 is a view of the FIG. 14 substrate fragment at a processing step subsequent to that depicted by FIG. 14.

Referring to FIG. 16 and after the etching, sacrificial retaining structure 60 (not shown) has been removed from the substrate, and then a capacitor dielectric material 71 and conductive second capacitor electrode material 73 have been formed over outer sidewall surfaces 72 of first capacitor electrode material 56 formed within the respective capacitor electrode openings, and as shown also formed within the container openings in the exemplary preferred embodiment. Any suitable materials 71 and 73 are contemplated, and whether existing or yet-to-be-developed. Second capacitor electrode material 73 might be the same or different in composition from that of first capacitor electrode material 56. Removal of retaining structure 60 is preferably conducted in a dry etching manner, for example with respect to photoresist by a dry $O_2$ etch. Preferred dry etching is more likely to cause the discrete capacitor electrode material of FIG. 15 to fall and adhere to immediately underlying material 28, as well as to each other, as opposed to being deposited elsewhere on the substrate.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a plurality of circuit components, comprising:

forming a plurality of circuit components within material over a substrate, the circuit components and material comprising respective elevationally outermost surfaces;

forming a sacrificial retaining structure comprising photoresist elevationally over both the elevationally outermost surfaces of the circuit components and the material, the sacrificial retaining structure leaving some of the material outwardly exposed;

with the sacrificial retaining structure over the substrate, etching at least some of the material from the substrate; and after the etching, removing the sacrificial retaining structure from the substrate.

2. The method of claim 1 wherein the retaining structure is formed to comprise a series of lines.

3. The method of claim 1 wherein the retaining structure is formed to have a thickness of from 100 Angstroms to 1000 Angstroms.

4. The method of claim 1 wherein the retaining structure is formed on the elevationally outermost surfaces of the plurality of circuit components.

5. The method of claim 1 wherein the retaining structure is formed to be homogeneous.

6. The method of claim 1 wherein the etching comprises wet etching.

7. The method of claim 1 wherein the removing is by etching, said removing by etching comprising dry etching.

8. The method of claim 1 wherein the material comprises silicon dioxide.

9. The method of claim 8 wherein the material comprises BPSG.

10. The method of claim 1 wherein the circuit components are formed to comprise openings therein, photoresist of the retaining structure being received within said openings.

11. The method of claim 10 wherein at least some of the photoresist within said opening tapers toward inner sidewalls of the circuit components.

12. The method of claim 10 wherein the circuit component openings comprise respective opening bases, wherein at least some photoresist is received on said respective opening bases.

13. The method of claim 1 wherein the circuit components are formed to comprise openings therein, photoresist of the retaining structure not being received within said openings.

14. A method of forming a plurality of structures suspended elevationally above a substrate, comprising:

forming a plurality of structures within material over a substrate, the structures and material comprising respective elevationally outermost surfaces, the plurality of structures comprising respective bases;

forming a retaining structure comprising photoresist elevationally over both the elevationally outermost surfaces of the structures and the material, the retaining structure leaving some of the material outwardly exposed; and with the retaining structure over the substrate, etching at least some of the material from the substrate to a location elevationally inward of the respective structure bases, the retaining structure suspending and holding the plurality of structures within free space above the substrate as the material is etched elevationally inward of the respective structure bases.

15. The method of claim 14 wherein the structures are formed to comprise openings therein, photoresist of the retaining structure being received within said openings.

16. The method of claim 15 wherein at least some of the photoresist within said opening tapers toward inner sidewalls of the structures.

17. The method of claim 15 wherein the circuit components are formed to comprise openings therein, photoresist of the retaining structure not being received within said openings.

18. The method of claim 14 wherein the retaining structure is formed to comprise a series of lines.

19. The method of claim 14 wherein the retaining structure is formed to have a thickness of from 100 Angstroms to 1000 Angstroms.

20. The method of claim 14 wherein the retaining structure is formed on the elevationally outermost surfaces of structures.

21. The method of claim 14 wherein the retaining structure is formed to be homogeneous.

22. A method of forming a plurality of circuit components, comprising:

forming a plurality of circuit components within material over a substrate, the material comprising elevationally outermost surfaces;

forming a sacrificial retaining structure comprising photoresist elevationally over the elevationally outermost surfaces of the material and over at least some portion of the plurality of circuit components, the sacrificial retaining structure leaving some of the material outwardly exposed;

with the sacrificial retaining structure over the substrate, etching at least some of the material from the substrate effective to expose outer sidewall surfaces of the plurality of circuit components while the sacrificial retaining structure at least in part supports the plurality of circuit components during said etching; and after the etching, removing the sacrificial retaining structure from the substrate.

23. The method of claim 22 wherein the removing is by etching, said removing by etching comprising dry etching.

24. The method of claim 22 wherein the circuit components are formed to comprise openings therein, photoresist of the retaining structure being received within said openings.

25. The method of claim 24 wherein at least some of the photoresist within said opening tapers toward inner sidewalls of the circuit components.

26. The method of claim 24 wherein the circuit component openings comprise respective opening bases, wherein at least some photoresist is received on said respective opening bases.

27. The method of claim 22 wherein the circuit components are formed to comprise openings therein, photoresist of the retaining structure not being received within said openings.

28. The method of claim 22 wherein the retaining structure is formed to comprise a series of lines.

29. The method of claim 22 wherein the retaining structure is formed on the elevationally outermost surfaces of structures.

30. The method of claim 22 wherein the retaining structure is formed to be homogeneous.

* * * * *